United States Patent
Mun et al.

(10) Patent No.: US 10,983,434 B2
(45) Date of Patent: Apr. 20, 2021

(54) PHOTORESIST COMPOSITION FOR DEEP ULTRAVIOLET LIGHT PATTERNING METHOD AND METHOD OF MANUFACTURING SEMICONDUCTOR DEVICE

(71) Applicant: Samsung Electronics Co., Ltd., Suwon-si (KR)

(72) Inventors: Jeong-ho Mun, Yongin-si (KR); Suk-koo Hong, Suwon-si (KR); Jin-joo Kim, Seoul (KR); Gum-hye Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 156 days.

(21) Appl. No.: 16/148,116

(22) Filed: Oct. 1, 2018

(65) Prior Publication Data
US 2019/0101826 A1    Apr. 4, 2019

(30) Foreign Application Priority Data
Sep. 29, 2017  (KR) .................. 10-2017-0128303

(51) Int. Cl.
*G03F 7/004*  (2006.01)
*H01L 27/11575*  (2017.01)
(Continued)

(52) U.S. Cl.
CPC .......... *G03F 7/0045* (2013.01); *G03F 7/0392* (2013.01); *G03F 7/11* (2013.01);
(Continued)

(58) Field of Classification Search
CPC ...... G03F 7/004; G03F 7/0045; G03F 7/2004; C07C 381/12; C07C 63/06; C07C 37/00;
(Continued)

(56) References Cited

U.S. PATENT DOCUMENTS 3,966,573 A  *  6/1976  Bean ..................... C08F 2/46
                                                   522/14
4,040,925 A  *  8/1977  McGinniss .......... C09D 5/4407
                                                   204/478
(Continued)

FOREIGN PATENT DOCUMENTS

JP  3461900 B2  10/2003
JP  1325392 B2   6/2009
(Continued)

*Primary Examiner* — Amanda C. Walke
(74) *Attorney, Agent, or Firm* — Muir Patent Law, PLLC

(57) ABSTRACT

Provided is a photoresist composition including a plasma light absorber and a method of manufacturing semiconductor devices using the same. The photoresist composition may include a developable polymer, a photoacid generator, a plasma light absorber, and an organic solvent. The plasma light absorber may be relatively transmissive to light used with a photolithographic patterning process (e.g., ultraviolet light) to pattern a layer formed with the photoresist composition and be relatively absorptive to light created in a subsequent etching process (such as light generated from a plasma). When forming a semiconductor device, a patterned photoresist layer may be more precisely generated and may better maintain is desired properties when used to etch various target layers of the semiconductor device.

18 Claims, 13 Drawing Sheets

(51) Int. Cl.
*G03F 7/039* (2006.01)
*G03F 7/11* (2006.01)
*G03F 7/16* (2006.01)
*G03F 7/20* (2006.01)
*G03F 7/32* (2006.01)
*G03F 7/38* (2006.01)
*H01L 21/027* (2006.01)
*H01L 21/311* (2006.01)
*H01L 27/11582* (2017.01)

(52) U.S. Cl.
CPC .............. *G03F 7/162* (2013.01); *G03F 7/168* (2013.01); *G03F 7/2004* (2013.01); *G03F 7/2006* (2013.01); *G03F 7/322* (2013.01); *G03F 7/325* (2013.01); *G03F 7/38* (2013.01); *H01L 21/0275* (2013.01); *H01L 21/31116* (2013.01); *H01L 21/31144* (2013.01); *H01L 27/11575* (2013.01); *H01L 27/11582* (2013.01)

(58) Field of Classification Search
CPC ....... C07C 47/58; C07C 47/54; C07C 47/542; C07C 47/56
See application file for complete search history.

(56) References Cited

U.S. PATENT DOCUMENTS

| | | | |
|---|---|---|---|
| 4,052,280 A * | 10/1977 | McGinnis | C08F 8/00 522/33 |
| 4,605,465 A * | 8/1986 | Morgan | B32B 37/12 156/273.3 |
| 5,266,440 A * | 11/1993 | Zampini | G03F 7/0226 430/165 |
| 5,736,297 A | 4/1998 | Roeschert et al. | |
| 5,931,995 A * | 8/1999 | Malhotra | C09D 11/34 106/31.21 |
| 6,358,665 B1 * | 3/2002 | Pawlowski | C07C 309/06 430/270.1 |
| 6,379,869 B1 | 4/2002 | Schroeder et al. | |
| 6,780,900 B1 * | 8/2004 | Malhotra | C08K 5/0008 347/99 |
| 7,157,197 B2 | 1/2007 | Aoki et al. | |
| 7,438,995 B2 | 10/2008 | French et al. | |
| 8,211,614 B2 | 7/2012 | Sung et al. | |
| 9,746,768 B2 | 8/2017 | Ohnishi et al. | |
| 10,613,437 B2 * | 4/2020 | Hatakeyama | C07C 309/32 |
| 2011/0250396 A1 * | 10/2011 | Matsutani | H01L 23/3114 428/156 |
| 2012/0237874 A1 * | 9/2012 | Yamaguchi | C07D 335/02 430/281.1 |
| 2015/0362835 A1 * | 12/2015 | Ohnishi | G03F 7/322 430/270.1 |
| 2018/0246408 A1 * | 8/2018 | Robinson | G03F 7/0233 |

FOREIGN PATENT DOCUMENTS

| | | |
|---|---|---|
| JP | 5520488 B2 | 4/2014 |
| KR | 10-2000-0076997 A | 12/2000 |
| KR | 10-0685318 B1 | 2/2007 |
| KR | 10-2015-0112960 A | 10/2015 |

* cited by examiner

PHOTORESIST COMPOSITION FOR DEEP ULTRAVIOLET LIGHT PATTERNING METHOD AND METHOD OF MANUFACTURING SEMICONDUCTOR DEVICE

CROSS-REFERENCE TO RELATED APPLICATION

This application claims the benefit of Korean Patent Application No. 10-2017-0128303, filed on Sep. 29, 2017, in the Korean Intellectual Property Office, the disclosure of which is incorporated herein in its entirety by reference.

BACKGROUND

The inventive concept relates to a photoresist composition for deep ultraviolet (DUV) light, a patterning method, and a method of manufacturing a semiconductor device.

A variety of manufacturing methods are proposed to manufacture semiconductor apparatuses. In some methods, and a thick photoresist is desired. However, when a photoresist pattern is thick, the transmittance of the photoresist may become a problem, and thus, efforts to increase transmittance are required. However, efforts to increase transmittance involve various optical problems, and thus various technical problems should be solved simultaneously.

SUMMARY

The inventive concept provides a photoresist composition capable of forming a photoresist pattern having a large thickness that may all for a high-quality etching of an underlying layer. The photoresist composition may be used with deep ultraviolet (DUV) light in a photolithographic exposure process.

The inventive concept also provides a method of manufacturing a semiconductor device by using the photoresist composition.

According to an aspect of the inventive concept, there is provided a photoresist composition including a photosensitive polymer, a plasma light absorber, and an organic solvent. The photosensitive polymer may be a polymer capable of undergoing a photochemical reaction due to DUV light, wherein a maximum absorbance of the plasma light absorber for light of a first wavelength range is 0.5 or less times a maximum absorbance of the plasma light absorber for light of a second wavelength range, wherein the first wavelength range is from about 240 nm to about 255 nm, and wherein the second wavelength range is from about 270 nm to about 330 nm.

The photoresist composition may include a photosensitive polymer, a photoacid generator, a plasma light absorber, and an organic solvent, wherein the plasma light absorber has a structure of Chemical Formula 1.

[Chemical Formula 1]

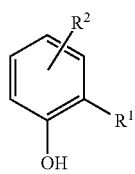

(where $R^1$ is a C1-C4 alkyl group, a C1-C4 alkoxy group, a carboxyl group, or —$R^I$—COOH ($R^I$ is a C1-C4 alkylenyl group), and $R^2$ is an aldehyde group, —$R^{II}$—CHO ($R^{II}$ is a C1-C4 alkylenyl group), a carboxyl group, —$R^I$—COOH ($R^I$ is a C1-C4 alkylenyl group), an amine, amide, or acrylic group that is unsubstituted or substituted with a C1-C4 alkyl group, or a C2-C6 acyl group.)

According to another aspect of the inventive concept, a method of manufacturing a semiconductor device includes, on a substrate, a layer of a photoresist composition for deep ultraviolet (DUV) light, exposing the layer of the photoresist composition for DUV light to krypton fluoride (KrF) laser light through a photo mask, forming a photoresist pattern by developing the exposed layer of the photoresist composition, and patterning the substrate in a plasma environment by using the photoresist pattern as an etching mask, wherein the photoresist composition for DUV light includes a plasma light absorber capable of at least partially absorbing light emitted in the plasma environment, and wherein the plasma light absorber has a structure of Chemical Formula 1.

The method of manufacturing a semiconductor device may include forming a preliminary stacked structure by alternately and repeatedly stacking a plurality of interlayer dielectric layers and sacrificial layers on a substrate including a cell area and a connection area adjacent the cell area, forming a photoresist mask so as to cover the entirety of the cell area and a part of the connection area, forming a first pattern by removing a first pair of a sacrificial layer and an interlayer dielectric layer thereunder, by using the photoresist mask as an etching mask, and forming a step pattern, wherein the forming of the step pattern includes exposing an end of the first pattern by removing a side surface of the photoresist mask, and forming a second pattern by removing a second pair of sacrificial layers exposed under the first pattern and an interlayer dielectric layer thereunder, wherein the photoresist mask includes a plasma light absorber of Chemical Formula 1 uniformly dispersed in a total volume of the photoresist mask, and wherein at least a part of the forming of the step pattern is performed in a plasma environment.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

A photoresist composition according to an embodiment of the inventive concept may include a photosensitive polymer, a photoacid generator, a plasma light absorber, and an organic solvent.

[Plasma Light Absorber]

The photoresist composition may include the plasma light absorber by about 1 weight % (wt %) to about 5 wt % with respect to a total weight of the photoresist composition. When the content of the plasma light absorber is excessively low, for example, is less than about 1 wt %, an effect achieved by adding the plasma light absorber may be insufficient for certain semiconductor processes. Otherwise, when the content of the plasma light absorber is excessively high, for example, is greater than about 5 wt %, an inappropriate photoresist pattern may be formed for various semiconductor processes.

The plasma light absorber may be highly transmissive to light of a wavelength band of, for example, 248 nm, which may be helpful in an exposure process using deep ultraviolet (DUV) light (ultraviolet light having a wavelength from about 200 nm to about 280 nm, e.g., 248 nm) and, more particularly, in an exposure process using a krypton fluoride (KrF) laser. The plasma light absorber may absorb light emitted from plasma generated in a dry etching process.

The plasma light absorber may have a structure of Chemical Formula 1.

[Chemical Formula 1]

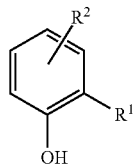

(where $R^1$ is a C1-C4 alkyl group, a C1-C4 alkoxy group, a carboxyl group, or COOH ($R^I$ is a C1-C4 alkylenyl group), and $R^2$ is an aldehyde group, —$R^{II}$—CHO ($R^{II}$ is a C1-C4 alkylenyl group), a carboxyl group, —$R^I$—COOH ($R^I$ is a C1-C4 alkylenyl group), an amine, amide, or acrylic group that is unsubstituted or substituted with a C1-C4 alkyl group, or a C2-C6 acyl group.)

Specifically, $R^1$ may be a methyl, ethyl, propyl, n-butyl, tert-butyl, methoxy, ethoxy, propoxy, n-butoxy, or tert-butoxy group, but is not limited thereto. Chemical Formula 1-1 shows examples of the plasma light absorber of Chemical Formula 1.

[Chemical Formula 1-1]

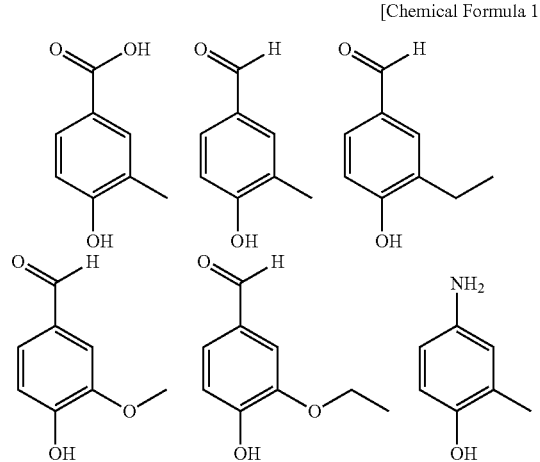

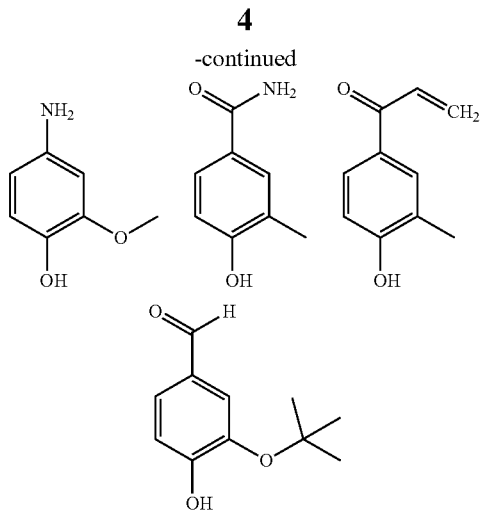

Chemical Formula 1-2 shows other examples of the plasma light absorber of Chemical Formula 1.

[Chemical Formula 1-2]

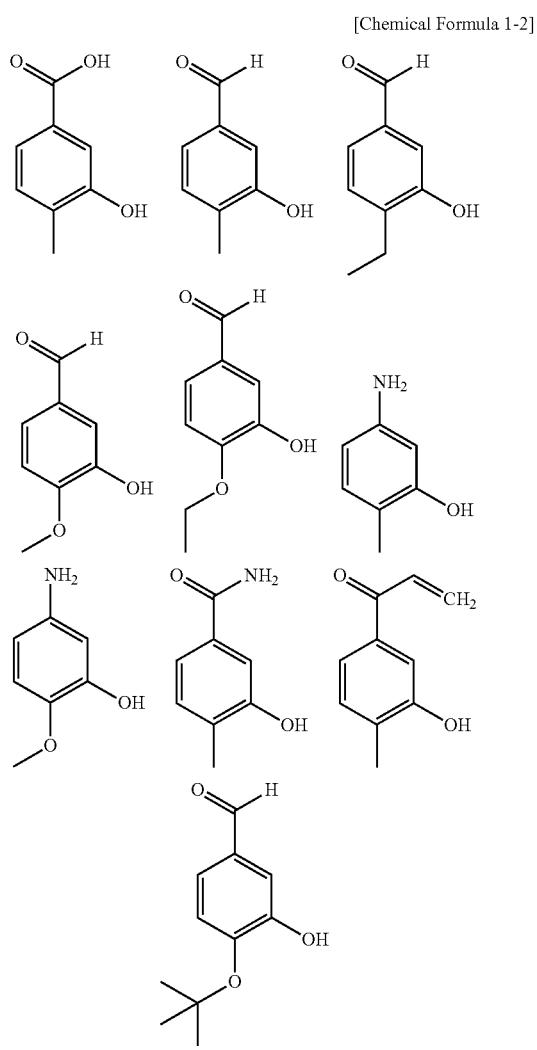

In some embodiments, the plasma light absorber may have a structure of Chemical Formula 2.

[Chemical Formula 2]

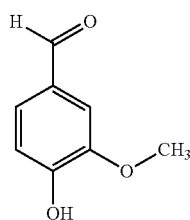

Figure 1:
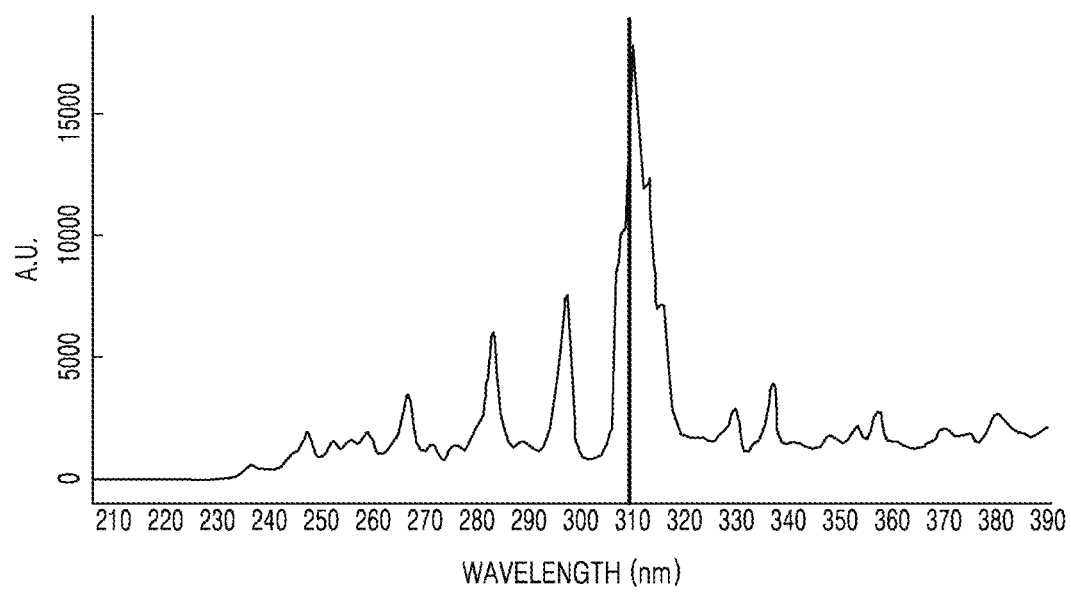
FIG. 1 is a graph showing a spectrum of light generated from oxygen plasma.

Unless context indicates otherwise, "a first wavelength range" as used herein refers to a main wavelength range of light emitted in the KrF exposure process, more particularly, from about 240 nm to about 255 nm. Unless context indicates otherwise, "a second wavelength range" refers to a main wavelength range of light emitted from plasma, and more particularly, oxygen plasma generated in the dry etching process, and more particularly, from about 270 nm to about 330 nm. FIG. 1 is a graph showing the spectrum of light generated from an oxygen plasma used for dry etching (intensity (arbitrary unit a.u.) v. wavelength (nm)). As shown in FIG. 1, dominant peaks of intensity are observed in a range between about 280 nm and about 320 nm.

The plasma light absorber may have characteristics of transmitting light of the first wavelength range well and absorbing light of the second wavelength range well. Specifically, a maximum absorbance of the plasma light absorber for light of the first wavelength range may be 0.5 or less times a maximum absorbance of the plasma light absorber for light of the second wavelength range. In some embodiments, the maximum absorbance of the plasma light absorber for light of the first wavelength range may be about 0.01 times to about 0.5 times, about 0.05 times to about 0.4 times, or about 0.1 times to about 0.3 times the maximum absorbance of the plasma light absorber for light of the second wavelength range.

In some embodiments, an average absorbance of the plasma light absorber for light of the first wavelength range may be 0.5 or less times an average absorbance of the plasma light absorber for light of the second wavelength range. In some embodiments, the average absorbance of the plasma light absorber for light of the first wavelength range may be about 0.01 times to about 0.5 times, about 0.05 times to about 0.4 times, or about 0.1 times to about 0.3 times the average absorbance of the plasma light absorber for light of the second wavelength range.

In some embodiments, a maximum transmittance of the plasma light absorber for light of the first wavelength range may be 1.1 or more times a maximum transmittance of the plasma light absorber for light of the second wavelength range. In some embodiments, the maximum transmittance of the plasma light absorber for light of the first wavelength range may be about 1.1 times to about 2 times, about 1.1 times to about 1.8 times, or about 1.2 times to about 1.5 times the maximum transmittance of the plasma light absorber for light of the second wavelength range.

Since the plasma light absorber transmits light of the first wavelength range well, even when contained in the photoresist composition, the plasma light absorber does not suppress a photochemical reaction of the photosensitive polymer in the exposure process using a KrF excimer laser. Since the plasma light absorber absorbs light of the second wavelength range well, light emitted from plasma in the dry etching process using a photoresist pattern formed of the photoresist composition (and dominantly having peaks in the second wavelength range) may be effectively absorbed.

The photosensitive polymer, which has not reacted yet, is present in the photoresist pattern. When light emitted from plasma is not blocked in the etching process, the photosensitive polymer may also undergo a photochemical reaction in the etching process and thus the quality of etching may be reduced. As such, by blocking light emitted from plasma, the photochemical reaction of the photosensitive polymer in the etching process may be suppressed and thus improved etching may be achieved.

[Photoacid Generator]

In addition, when a photoresist pattern is excessively thick, transmittance of the photoresist composition may become a problem. A photoacid generator (PAG) of the photoresist composition may influence on the transmittance. As such, use a photoacid generator having a low absorbance may be beneficial for a photoresist composition. Aromatic rings as in a phenyl group may increase the absorbance. A widely used conventional photoacid generator such as triphenyl sulfonium (TPS) absorbs much light and may not be advantageous in terms of transmittance when added into the thick photoresist pattern. Therefore, a photoacid generator of Chemical Formula 3 or 4, which has a lower absorbance compared to the conventional TPS, may provide better transmittance and may be beneficially used in forming the thick photoresist pattern.

[Chemical Formula 3]

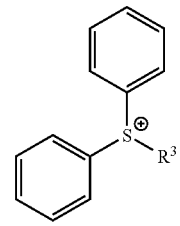

(where $R^3$ is a substituted or unsubstituted C1-C60 alkyl or alkoxy group, a carboxyl group, —$R^I$—COOH ($R^I$ is a C1-C60 alkylenyl group), a substituted or unsubstituted C2-C60 alkenyl or alkynyl group, or a substituted or unsubstituted C3-C60 cycloalkyl group.)

[Chemical Formula 4]

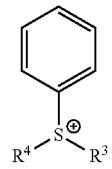

(where each of $R^3$ and $R^4$ is a substituted or unsubstituted C1-C60 alkyl or alkoxy group, a carboxyl group, —$R^I$—COOH ($R^I$ is a C1-C60 alkylenyl group), a substituted or unsubstituted C2-C60 alkenyl or alkynyl group, or a substituted or unsubstituted C3-C60 cycloalkyl group.)

Compared to the case using TPS, when the photoacid generator of Chemical Formula 3 or 4 is used, light may be better transmitted through a thick photoresist pattern and thus a high-quality pattern may be obtained.

Although Chemical Formulae 3 and 4 show compounds using sulfur as a central element of the photoacid generator, the inventive concept is not limited thereto. For example, iodine may be used as the central element as shown in Chemical Formula 5.

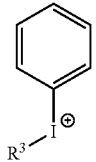

[Chemical Formula 5]

(where $R^3$ is a substituted or unsubstituted C1-C60 alkyl or alkoxy group, a carboxyl group, —$R^I$—COOH ($R^I$ is a C1-C60 alkylenyl group), a substituted or unsubstituted C2-C60 alkenyl or alkynyl group, or a substituted or unsubstituted C3-C60 cycloalkyl group.)

Figure 2:
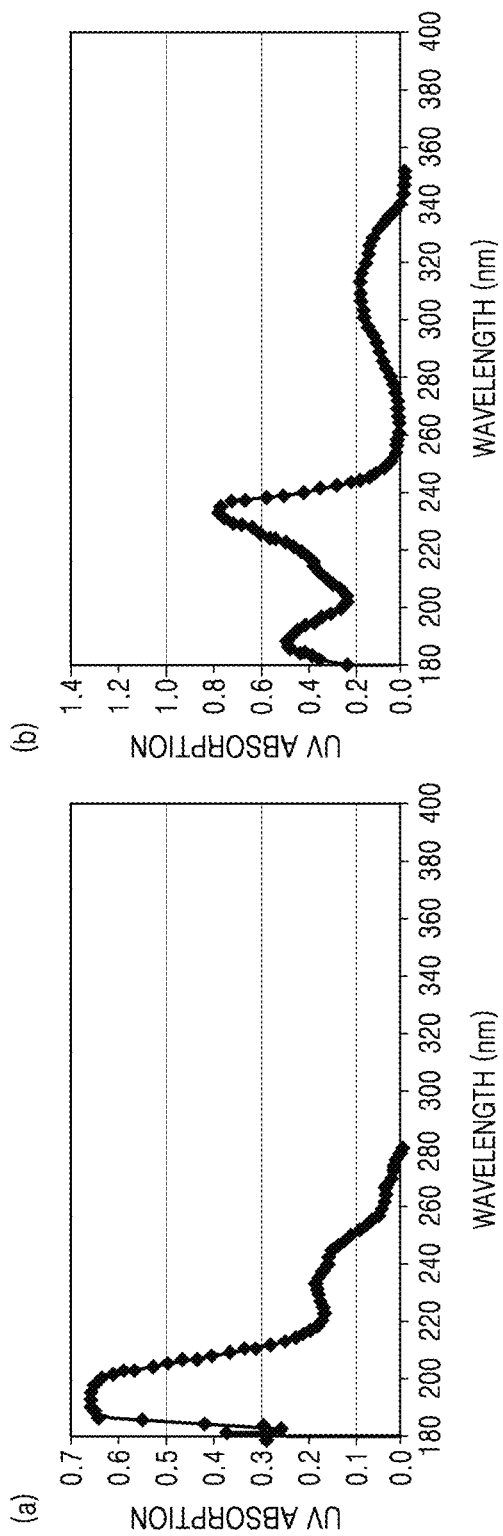
FIG. 2 includes graphs showing absorption spectra of triphenyl sulfonium (TPS) and a photoacid generator of Chemical Formula 4.

FIG. 2 includes graphs showing absorption spectra of (a) triphenyl sulfonium (TPS) as a comparative example and (b) the photoacid generator of Chemical Formula 4. The left side of FIG. 2 shows the absorption spectrum of TPS, and the right side of FIG. 2 shows the absorption spectrum of the photoacid generator of Chemical Formula 4 (where each of $R^3$ and $R^4$ is methyl).

As shown in FIG. 2, compared to TPS, the photoacid generator of Chemical Formula 4 shows much lower absorption characteristics near 248 nm. However, unlike TPS, the photoacid generator of Chemical Formula 4 partially absorbs light in a wavelength range of about 270 nm to about 340 nm. The fact that the photoacid generator of Chemical Formula 4 absorbs the light of the wavelength range of about 270 nm to about 340 nm can mean that a photochemical reaction can be triggered by light generated in the etching process using plasma. This can lead to a reduction in quality of etching as described above.

The inventors have found that, when an additive capable of absorbing light of the second wavelength range but is sufficiently transmissive to light of a dominant wavelength range of a KrF excimer laser (i.e., the first wavelength range) is added, a thick photoresist pattern of high quality may be formed (because light of the first wavelength range is transmitted well) and the high quality of the pattern may be maintained in the etching process (because light of the second wavelength range may be absorbed). For example, the inventors have found the compound of Chemical Formula 1 may be used as a plasma light absorber capable of absorbing light of the second wavelength range well and while transmitting light of the first wavelength range well.

Figure 3:
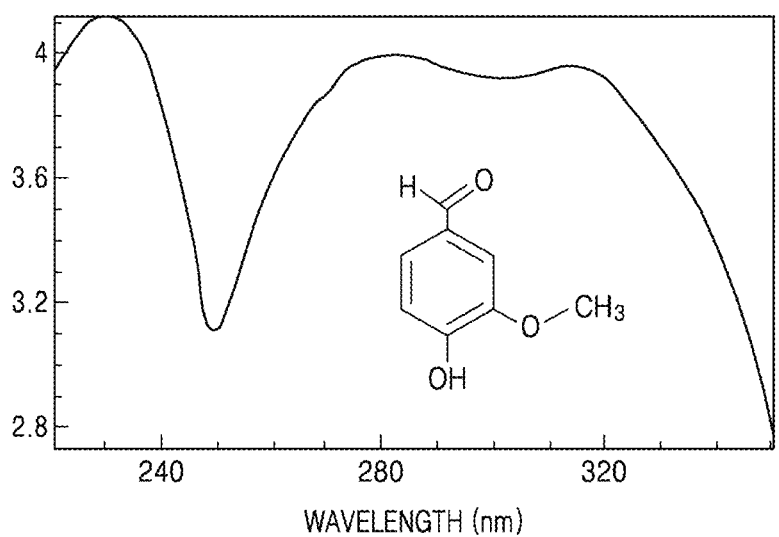
FIG. 3 is a graph showing an absorption spectrum of a plasma light absorber of Chemical Formula 2.

FIG. 3 is a graph showing an absorption spectrum of the plasma light absorber of Chemical Formula 2.

Referring to FIG. 3, it is shown that the plasma light absorber of Chemical Formula 2 has a very low absorbance in the first wavelength range, and more particularly, near 248 nm. It is also shown that the plasma light absorber of Chemical Formula 2 maintains a very high absorbance in the second wavelength range.

The photoresist composition may include the photoacid generator by about 1 wt % to about 10 wt % with respect to the total weight of the photoresist composition. When the content of the photoacid generator is excessively low, for example, is less than about 1 wt %, chemical amplification may be insufficient. Otherwise, when the content of the photoacid generator is excessively high, for example, is greater than about 10 wt %, a product such as a hydrogen gas may be excessively generated to reduce the quality of a material layer.

[Photosensitive Polymer]

The photosensitive polymer may be a polymer capable of undergoing a photochemical reaction due to deep ultraviolet (DUV) light. For example, a photosensitive polymer may be a polymer that undergoes a chemical reaction when a photoacid generator (PAG), mixed with the photosensitive polymer is exposed to light, such as deep ultraviolet light, to generate acid and such generated acid causes the polymer to undergo a chemical reaction to cause the polymer to increase its hydrophilicity or hydrophobia. It should be appreciated that a photosensitive polymer need not be directly sensitive to light (e.g., exposure to light of a photosensitive polymer need not alter the chemical composition of the photosensitive polymer, although the chemical composition of the photosensitive polymer may be altered due to the acid generated by the exposed PAG with which the photosensitive polymer is mixed). In some embodiments, solubility of the photosensitive polymer in alkali may be increased due to the photochemical reaction. In some embodiments, the photosensitive polymer may have a structure in which a protecting group is bonded to a repeating unit, and the protecting group may be deprotected in the exposure process such that the photosensitive polymer is soluble well in alkali. The photoresist may be a positive photoresist where portions of the photoresist that are intended to be removed from later developing the photoresist are exposed to light (e.g., DUV light). The deprotected protecting group may generate a new acid to perform chemical amplification.

(Novolac Resin)

In some embodiments, the photosensitive polymer may be a novolac resin. For example, the novolac resin may be a resin having a repeating unit shown in Chemical Formula 6.

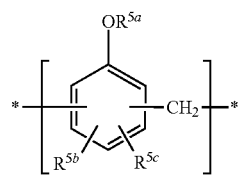

[Chemical Formula 6]

In Chemical Formula 6, $R^{5a}$ is an acid-dissociative protecting group, and each of $R^{5b}$ and $R^{5c}$ is a hydrogen atom or a C1-C6 alkyl group. $R^{5a}$ is a C1-C6 linear, branched, or cyclic alkyl group, a vinyloxyethyl group, a tetrahydropyranyl group, a tetrahydrofuranyl group, a trialkylsilyl group, isonorbornyl, 2-methyl-2-adamantyl, 2-ethyl-2-adamantyl, 3-tetrahydrofuranyl, 3-oxocyclohexyl, γ-butyrolactone-3-yl, mevalonolactone, γ-butyrolactone-2-yl, 3-methyl-γ-butyrolactone-3-yl, 2-tetrahydropyranyl, 2-tetrahydrofuranyl, 2,3-propylenecarbonate-1-yl, 1-methoxyethyl, 1-ethoxyethyl, 1-(2-methoxyethoxy)ethyl, 1-(2-acetoxyethoxy)ethyl, t-buthoxycarbonylmethyl, methoxymethyl, ethoxymethyl, trimethoxysilyl, or triethoxysilyl, and may be a methoxyethyl, ethoxyethyl, n-propoxyethyl, isopropoxyethyl, n-butoxyethyl, isobutoxyethyl, tert-butoxyethyl, cyclohexyloxyethyl, methoxypropyl, ethoxypropyl, 1-methoxy-1-methylethyl, 1-ethoxy-1-methylethyl, tert-butoxycarbonyl (t-BOC), or tert-butoxycarbonylmethyl group. The linear or branched alkyl group may include, for example, a methyl, ethyl, propyl, isopropyl, n-butyl, isobutyl, tert-butyl, pentyl, isopentyl, or neopentyl group. The cyclic alkyl group may include, for example, a cyclopentyl or cyclohexyl group.

(Polyhydroxystyrene Resin)

In some embodiments, the photosensitive polymer may be a polyhydroxystyrene (PHS) resin. For example, the PHS resin may be a resin having a repeating unit shown in Chemical Formula 7.

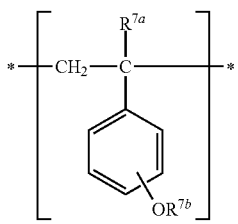
[Chemical Formula 7]

In Chemical Formula 7, $R^{7a}$ is a hydrogen atom or C1-C6 alkyl group, and $R^{7b}$ is an acid-dissociative protecting group. Specific examples thereof are as listed above in relation to Chemical Formula 6.

In some embodiments, the PHS resin may include another polymerizable compound as a repeating unit. Examples of the polymerizable compound may include monocarboxylic acids such as acrylic acid, methacrylic acid, and crotonic acid; dicarboxylic acids such as maleic acid, fumaric acid, and itaconic acid; methacrylic acid derivatives having a carboxyl group and an ester bond, such as 2-methacryloyloxyethyl succinic acid, 2-methacryloyloxyethyl maleic acid, 2-methacryloyloxyethyl phthalic acid, and 2-methacryloyloxyethyl hexahydrophthalic acid; (meth)acrylic acid alkyl esters such as methyl (meth)acrylate, ethyl (meth)acrylate, and butyl (meth)acrylate; (meth)acrylic acid hydroxyalkyl esters such as 2-hydroxyethyl (meth)acrylate and 2-hydroxypropyl (meth)acrylate; (meth)acrylic acid aryl esters such as phenyl (meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethyl styrene, vinyltoluene, hydroxystyrene, α-methylhydroxystyrene, and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide. However, the inventive concept is not limited thereto.

(Acrylic Resin)

In some embodiments, the photosensitive polymer may be an acrylic resin. For example, the acrylic resin may be a resin having a repeating unit shown in Chemical Formula 8.

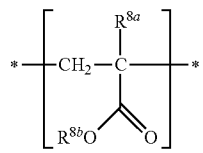
[Chemical Formula 8]

In Chemical Formula 8, $R^{8a}$ is a hydrogen atom, a C1-C6 linear or branched alkyl group, a fluorine atom, or a C1-C6 linear or branched fluorinated alkyl group, and $R^{8b}$ is an acid-dissociative protecting group. Specific examples thereof are as listed above in relation to Chemical Formula 6.

In some embodiments, the photosensitive polymer may include a (meth)acrylate-based polymer. The (meth)acrylate-based polymer may be an aliphatic (meth)acrylate-based polymer and may include, for example, polymethylmethacrylate (PMMA), poly(t-butylmethacrylate), poly(methacrylic acid), poly(norbornylmethacrylate), a binary or ternary copolymer of repeating units of the above (meth)acrylate-based polymers, or a combination thereof.

In some embodiments, the acrylic resin may include another polymerizable compound as a repeating unit. Examples of the polymerizable compound may include acrylates having an ether bond, such as 2-methoxyethyl (meth)acrylate, 2-ethoxyethyl (meth)acrylate, methoxytriethyleneglycol (meth)acrylate, 3-methoxybutyl (meth)acrylate, ethyl carbitol (meth)acrylate, phenoxypolyethylene glycol (meth)acrylate, methoxypolyethylene glycol (meth)acrylate, methoxypolypropylene glycol (meth)acrylate, and tetrahydrofurfuryl (meth)acrylate; monocarboxylic acids such as acrylic acid, methacrylic acid, and crotonic acid; dicarboxylic acids such as maleic acid, fumaric acid, and itaconic acid; methacrylic acid derivatives having a carboxyl group and an ester bond, such as 2-methacryloyloxyethyl succinic acid, 2-methacryloyloxyethyl maleic acid, 2-methacryloyloxyethylphthalic acid, and 2-methacryloyloxyethyl hexahydrophthalic acid; (meth)acrylic acid alkyl esters such as methyl (meth)acrylate, ethyl (meth)acrylate, butyl (meth)acrylate, and cyclohexyl (meth)acrylate; (meth)acrylic acid hydroxyalkyl esters such as 2-hydroxyethyl (meth)acrylate and 2-hydroxypropyl (meth)acrylate; (meth)acrylic acid aryl esters such as phenyl (meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethyl styrene, vinyltoluene, hydroxystyrene, α-methylhydroxystyrene, and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide. However, the inventive concept is not limited thereto.

The photosensitive polymer may have about 10,000 to about 600,000 weight average molecular weight (Mw). In some embodiments, the photosensitive polymer may have about 20,000 to about 400,000 Mw, or about 30,000 to about 300,000 Mw. In some embodiments, the above Mw values may be values measured using gel permeation chromatography (GPC) by setting polystyrene as a standard.

The photosensitive polymer may have a polydispersity index (PI) of about 1 to about 1.2. The content of the photosensitive polymer may be about 5 wt % to about 60 wt % with respect to the total weight of the photoresist composition.

[Organic Solvent]

Examples of the organic solvent may include, ketones such as acetone, methyl ethyl ketone, cyclohexanone, methyl isoamyl ketone, and 2-heptanone; polyhydric alcohols and derivatives thereof, such as monomethyl ether, monoethyl ether, monopropyl ether, monobutyl ether, and monophenyl ether of ethylene glycol, ethylene glycol monoacetate, diethylene glycol, diethylene glycol monoacetate, propylene glycol, propylene glycol monoacetate, dipropylene glycol, and dipropylene glycol monoacetate; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, ethyl pyruvate, ethyl ethoxyacetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanate, 3-methoxybutyl acetate, and 3-methyl-3-methoxybutyl acetate; and aromatic hydrocarbons such as toluene and xylene. One or a combination of two or more of these materials may be used as the organic solvent.

The content of the organic solvent may be adjusted in such a manner that a density of a solid part including the photosensitive polymer is about 20 wt % to about 70 wt % with respect to the total weight of the photoresist composition.

[Additional Elements]

The photoresist composition for DUV light may further include other materials, such as a leveling agent, a surfactant, an adhesion promoter, a quencher, a cross linking agent, etc., as needed. Examples of the leveling agent and the surfactant may include fluoroalkylbenzene sulfonate, fluoroalkyl carboxylate, fluoroalkyl polyoxyethylene ether, fluoroalkylammonium iodide, fluoroalkyl betaine, fluoroalkyl sulfonate, diglycerin tetrakis(fluoroalkylpolyoxyethylene ether), fluoroalkyl trimethyl ammonium salt, fluoroalkylamino sulfonate, polyoxyethylene nonylphenyl ether, polyoxyethylene octylphenyl ether, polyoxyethylene alkyl ether, polyoxyethylene lauryl ether, polyoxyethylene oleyl ether, polyoxyethylene tridecyl ether, polyoxyethylene cetyl ether, polyoxyethylene stearyl ether, polyoxyethylene laurate, polyoxyethylene oleate, polyoxyethylene stearate, polyoxyethylene laurylamine, sorbitan laurate, sorbitan palmitate, sorbitan stearate, sorbitan oleate, sorbitan fatty acid ester, polyoxyethylene sorbitan laurate, polyoxyethylene sorbitan palmitate, polyoxyethylene sorbitan stearate, polyoxyethylene sorbitan oleate, polyoxyethylene naphthyl ether, alkylbenzene sulfonate, and alkyl diphenyl ether disulfonate, but are not limited thereto.

Each of the leveling agent and the surfactant may have a content of about 0.001 wt % to about 0.1 wt % with respect to the total weight of the photoresist composition for DUV light.

The photoresist composition for DUV light may further include an adhesion promoter to enhance adhesion to a substrate, as needed. The adhesion promoter may include a silane-based, aluminum-based, or titanate-based compound. Specifically, the adhesion promoter may include, for example, 3-glycidoxypropyldimethylethoxysilane, 3-glycidoxypropylmethyldiethoxysilane, 3-glycidoxypropyltrimethoxysilane, acetoalkoxyaluminumdiisopropylate, or tetraisopropylbis(dioctylphosphite)titanate, but is not limited thereto.

The adhesion promoter may have a content of about 0.1 wt % to about 10 wt % with respect to the total weight of the photoresist composition for DUV light.

The photoresist composition for DUV light may further include a quencher to adjust a diffusion rate of a material such as generated acid, as needed.

The quencher may include a primary, secondary, or tertiary amine compound, and more particularly, an amine compound which has a hydroxyl group, an ether bond, an ester bond, a lactone ring, a cyano group, or a sulfonic acid ester bond or is obtained by protecting a primary or secondary amine by using a carbamate group; an onium salt such as a sulfonium, iodonium, or ammonium salt of a carboxylic acid; or a combination thereof, but is not limited thereto.

The quencher may have a content of about 0.01 wt % to about 5 wt % with respect to the total weight of the photoresist composition for DUV light.

The photoresist composition for DUV light may further include a crosslinking agent, as needed.

The crosslinking agent may be a nitrogen-containing compound having at least two crosslinking substituents (e.g., methylol, methoxymethyl, or butoxymethyl groups), but is not limited thereto. Specifically, the crosslinking agent may include, for example, hexamethoxymethylmelamine, tetramethoxymethylbenzoguanamine, 1,3,4,6-tetrakis(methoxymethyl)glycoluril, 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, or 1,1,3,3-tetrakis(methoxymethyl)urea.

The crosslinking agent may have a content of about 0.01 wt % to about 5 wt % with respect to the total weight of the photoresist composition for DUV light.

Using the photoresist composition for DUV light according to embodiments of the inventive concept, a photoresist pattern having a large thickness and ensuring high-quality etching of an underlying layer may be formed.

FIGS. 4A to 4I are cross-sectional views illustrating sequential processes of a method of manufacturing a vertical semiconductor device 100, according to an embodiment of the inventive concept.

Figure 4A:
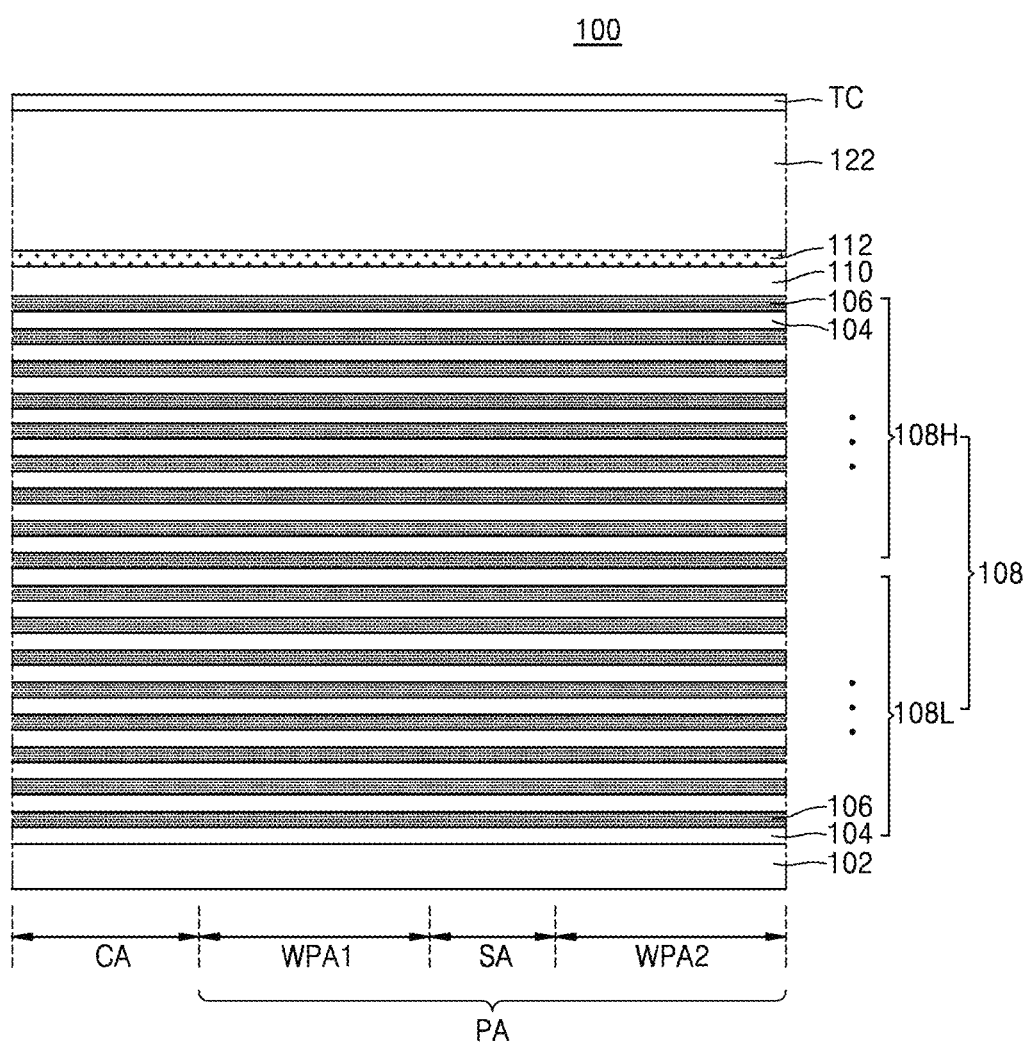
FIGS. 4A to 4I are cross-sectional views illustrating sequential processes of a method of manufacturing a vertical semiconductor device, according to an embodiment of the inventive concept.

Referring to FIG. 4A, a preliminary stacked structure 108 may be formed on the substrate 102.

The substrate 102 may be a crystalline semiconductor material and may be, for example, a silicon (Si) substrate, silicon germanium (SiGe) substrate, or silicon-on-insulator (SOI) substrate.

The substrate 102 may include a cell area CA and a connection area PA adjacent or surrounding the cell area CA. The connection area PA may include a sacrificial area SA, a first pad area WPA1, and a second pad area WPA2.

The preliminary stacked structure 108 may include interlayer dielectric layers 104 and sacrificial layers 106 which are alternately and repeatedly stacked on one another, and may include an upper preliminary stacked structure 108H and a lower preliminary stacked structure 108L. The interlayer dielectric layer 104 may include silicon oxide ($SiO_2$) but is not limited thereto. The sacrificial layers 106 may be formed of a material having etch selectivity with respect to the interlayer dielectric layers 104 and may be, for example, silicon nitride layers, silicon oxynitride layers, polysilicon layers, or polysilicon germanium layers.

A first capping layer 110 and a polysilicon layer 112 may be sequentially provided on the preliminary stacked structure 108. The first capping layer 110 may be formed of silicon oxide. The polysilicon layer 112 may be formed by depositing an amorphous silicon layer and then applying heat thereto.

A photoresist material layer 122 may be formed on the polysilicon layer 112. The photoresist material layer 122 may be formed based on, for example, a spin coating, roll coating, or screen printing process by using the above-described photoresist composition for DUV light. That is, the photoresist material layer 122 may include the plasma light absorber of Chemical Formula 1, and the plasma light absorber may be uniformly dispersed in the total volume of the photoresist material layer 122.

Then, the photoresist material layer 122 may be baked (e.g., post apply bake (PAB)-processed), for example, at a temperature of about 55° C. to about 150° C. for about 2 minutes to about 60 minutes.

A top coating layer TC may be further provided on the photoresist material layer 122. The top coating layer TC may serve to block or reduce incidence of light of an undesired wavelength range on the photoresist material layer 122 in an exposure process. In some embodiments, the top coating layer TC may not include the plasma light absorber of Chemical Formula 1. In some embodiments, the top coating layer TC may not include the plasma light absorber of Chemical Formula 2. In some embodiments, the top coating layer TC may be omitted.

Figure 4B:
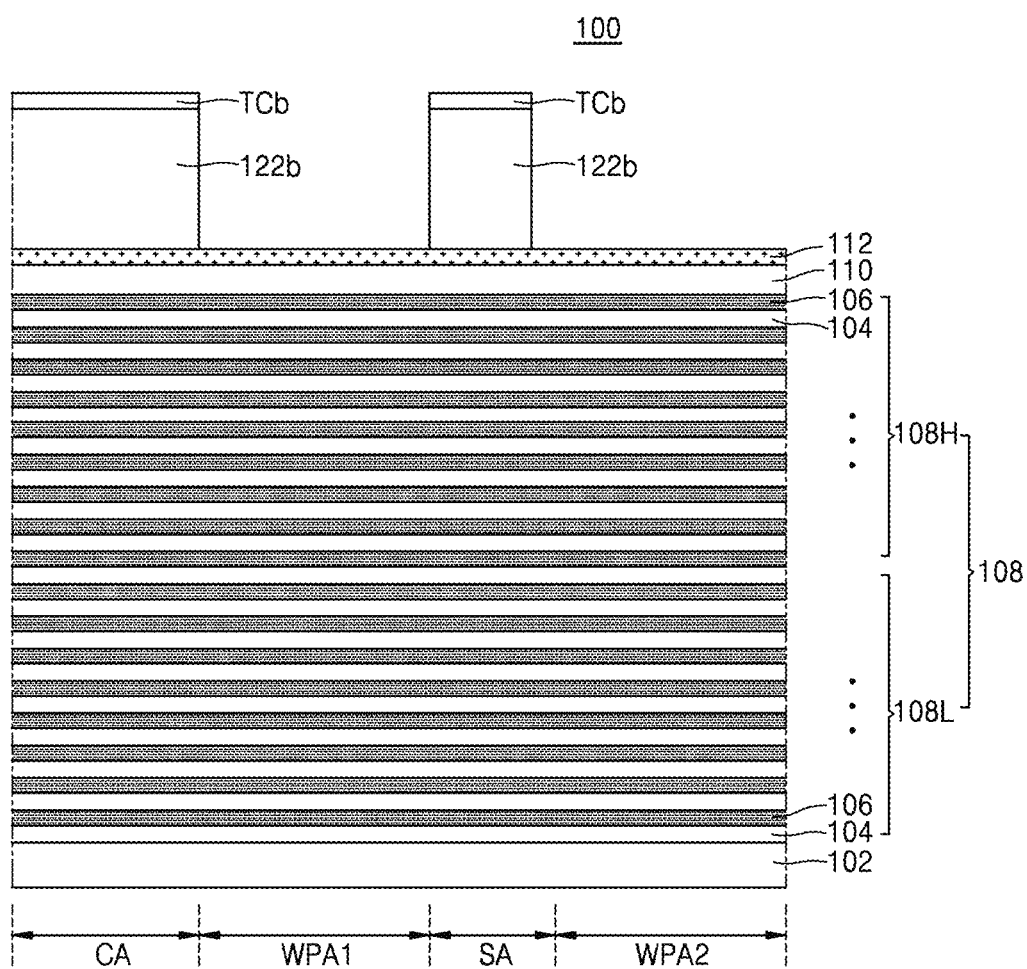

Referring to FIG. 4B, the photoresist material layer 122 is exposed in a photolithographic process. For example, using a photolithographic exposure apparatus a patterned photolithographic mask (also referred to as a photo mask) having a predetermined mask pattern may selectively expose the photoresist material layer 122 in accordance with the mask pattern. Light used in this case may be light of a KrF excimer laser, and a dominant wavelength thereof may be a wavelength of about 248 nm.

The plasma light absorber included in the photoresist material layer 122 may transmit light of the first wavelength range well, and more particularly, light of the wavelength of about 248 nm, and thus may not influence the exposure process. The composition of the plasma light absorber may not be altered during the exposure process.

After the exposure process, the photoresist material layer 122 is baked (e.g., post exposure bake (PEB)-processed). The PEB process may be performed at a temperature of about 80° C. to about 150° C. for about 40 seconds to about 600 seconds. The composition of the plasma light absorber may not be altered during this PEB process.

Then, the photoresist material layer 122 may be developed to obtain a first mask 122b (a photoresist pattern formed from patterning photoresist material layer 122). As a developer used in the development process, an aqueous alkaline solution, e.g., an aqueous solution of tetramethyl-ammonium hydroxide (TMAH) of about 0.1 wt % to about 10 wt %, may be used. The development may be a positive tone development. The developer may remove the portions of the photoresist exposed during the exposure process (e.g., exposed to the DUV light of an KrF excimer laser) while portions not exposed during the exposure process may remain to form the photoresist pattern.

Optionally, an organic developer, e.g., a ketone-based solvent, ester-based solvent, alcohol-based solvent, nitrile-based solvent, amide-based solvent, ether-based solvent, amide-based solvent, or hydrocarbon-based solvent, may be used for the development process. These solvents are well-known to one of ordinary skill in the art and thus specific examples thereof are not listed herein. When the organic developer is used, a surfactant may be added. The surfactant is not limited to any particular type and, for example, an ionic or nonionic fluorine-based and/or silicon-based surfactant may be used. In particular, a nonionic surfactant may be used and, specifically, a nonionic fluorine-based surfactant or a nonionic silicon-based surfactant may be used. When the surfactant is added, the surfactant is added by about 0.0001 wt % to about 5 wt %, about 0.005 wt % to about 2 wt %, or about 0.01 wt % to about 0.5 wt % with respect to a total weight of the organic developer.

The development process may be performed based on a known development method, e.g., a method of dipping a substrate in a developer for a certain time (a dipping method), a method of mounting a developer on the surface of a substrate due to surface tension and stopping moving for a certain time (a paddling method), a method of spraying a developer on the surface of a substrate (a spraying method), and a method of continuously ejecting a developer by scanning a developer ejecting nozzle at a constant speed on a substrate revolving at a constant speed (a dynamic dispensing method).

A rinsing (or washing) process using a rinsing liquid may be performed a known rinsing method. The rinsing method may include, for example, a method of continuously ejecting a rinsing liquid on a substrate revolving at a constant speed (a spin coating method), a method of dipping a substrate in a rinsing liquid for a certain time (a dipping method), or a method of spraying a rinsing liquid on the surface of a substrate (a spraying method).

In the rinsing process, pure water ($H_2O$) may be used for an alkali developer and a rinsing liquid containing an organic solvent may be used for an organic developer.

Although FIG. 4B shows that a top coating layer pattern TCb remains on the first mask 122b, the top coating layer pattern TCb may be removed after the developing and rinsing processes.

Figure 4C:
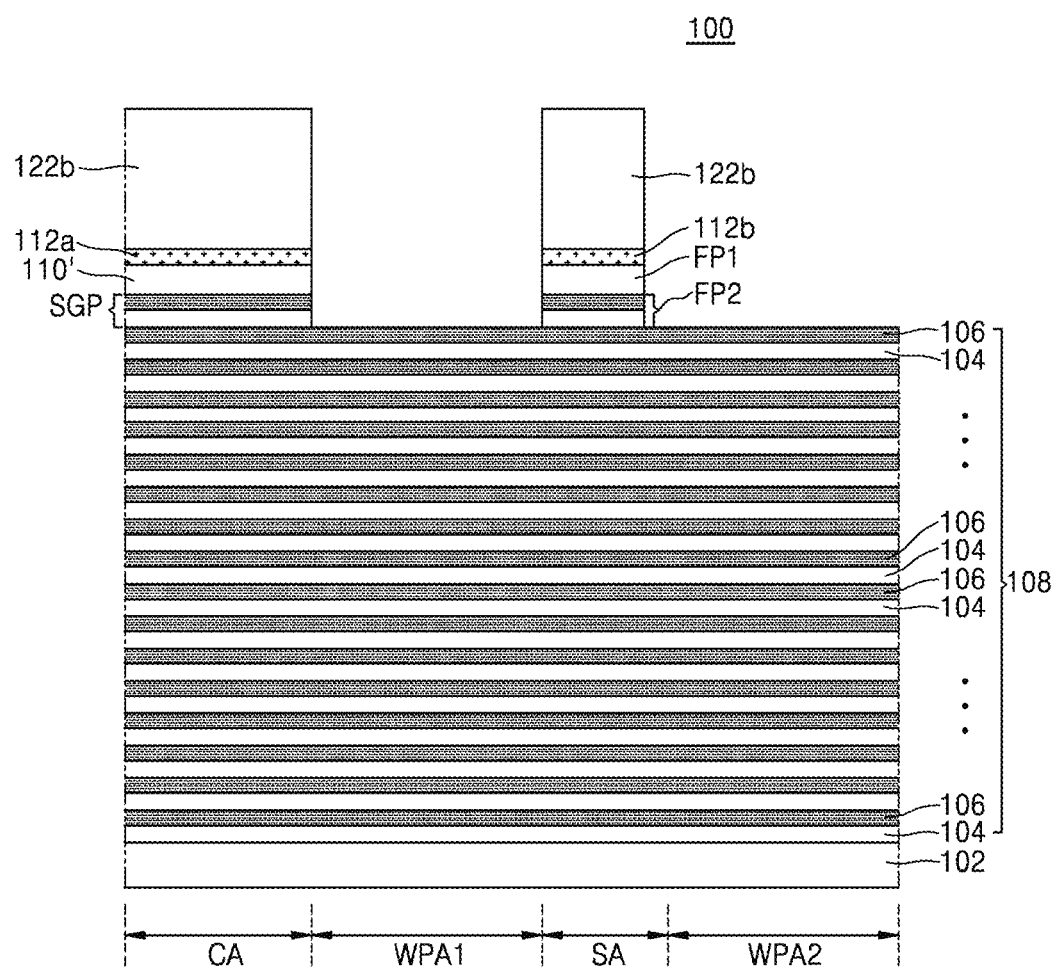

Referring to FIG. 4C, a first etching process is performed to remove the polysilicon layer 112, the first capping layer 110 under the polysilicon layer 112, and the sacrificial layer 106 and the interlayer dielectric layer 104 under the first capping layer 110, in the first and second pad areas WPA1 and WPA2.

The first etching process may be performed using $O_2$ plasma at a power of about 80 W to about 500 W. In this case, light emitted from the $O_2$ plasma may also be at least partially irradiated onto the first mask 122b, and may be absorbed by the plasma light absorber uniformly dispersed in the first mask 122b.

Figure 5A:
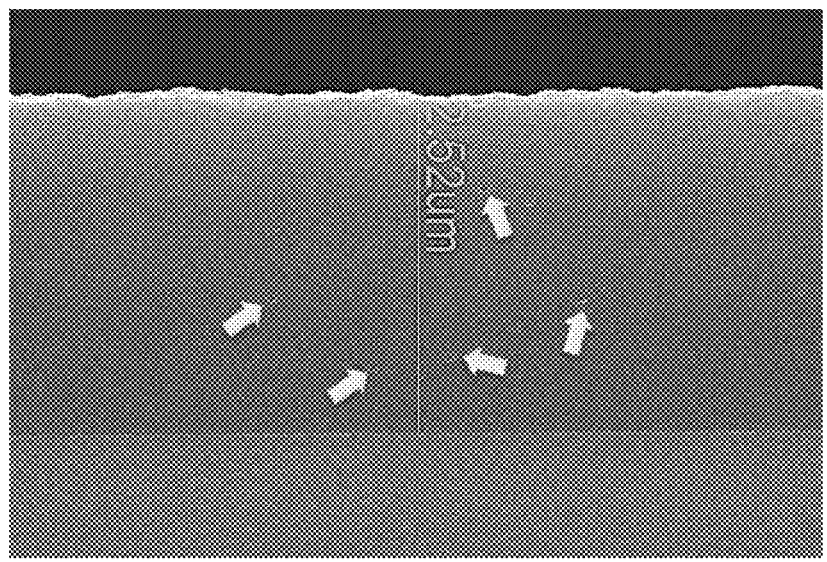
FIG. 5A is an image showing a cross-sectional side view of a mask formed of a photoresist composition not containing a plasma light absorber, after an etching process.
Figure 5B:
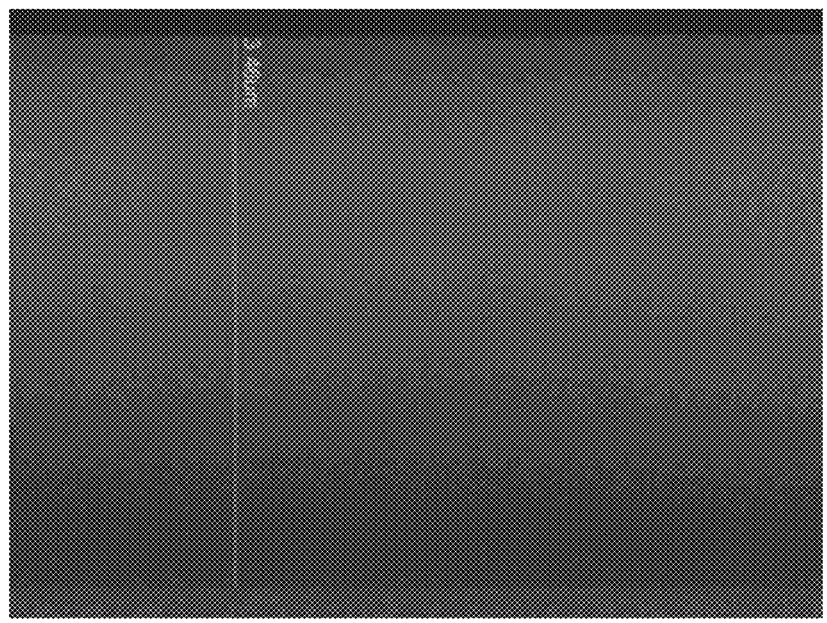
FIG. 5B is an image showing a cross-sectional side view of a mask formed of a photoresist composition containing a plasma light absorber, after an etching process.

FIG. 5A is an image showing a cross-sectional side view of a mask formed of a photoresist composition not containing a plasma light absorber, after an etching process, and FIG. 5B is an image showing a cross-sectional side view of a mask formed of a photoresist composition containing a plasma light absorber, after an etching process.

Referring to FIG. 5A, the top surface of the photoresist composition is rough and a plurality of bubbles may be observed from the cross-sectional side view. It is inferred that the bubbles are hydrogen bubbles and are generated as a result of triggering a photochemical reaction by plasma light incident onto the photoresist during the etching process. The bubbles on the side cross-section may cause distortion in a pattern generated in the underlying layer in the etching process and thus may not be desirable.

Referring to FIG. 5B, a top surface is flat and bubbles are not observed on the side cross-section.

Referring back to FIG. 4C, due to the first etching process, a first polysilicon pattern 112a, a preliminary string selection gate pattern SGP, and a capping pattern 110' may be formed in the cell area CA, and a second polysilicon pattern 112b, a first floating pattern FP1 under the second polysilicon pattern 112b, and a second floating pattern FP2 under the first floating pattern FP1 may be formed in the sacrificial area SA.

Since the second polysilicon pattern 112b may serve as an etch stop pattern for preventing an underlying layer from being etched during a subsequent step-forming process, the second polysilicon pattern 112b is referred to as an etch stop pattern 112b in the following description.

Figure 4D:
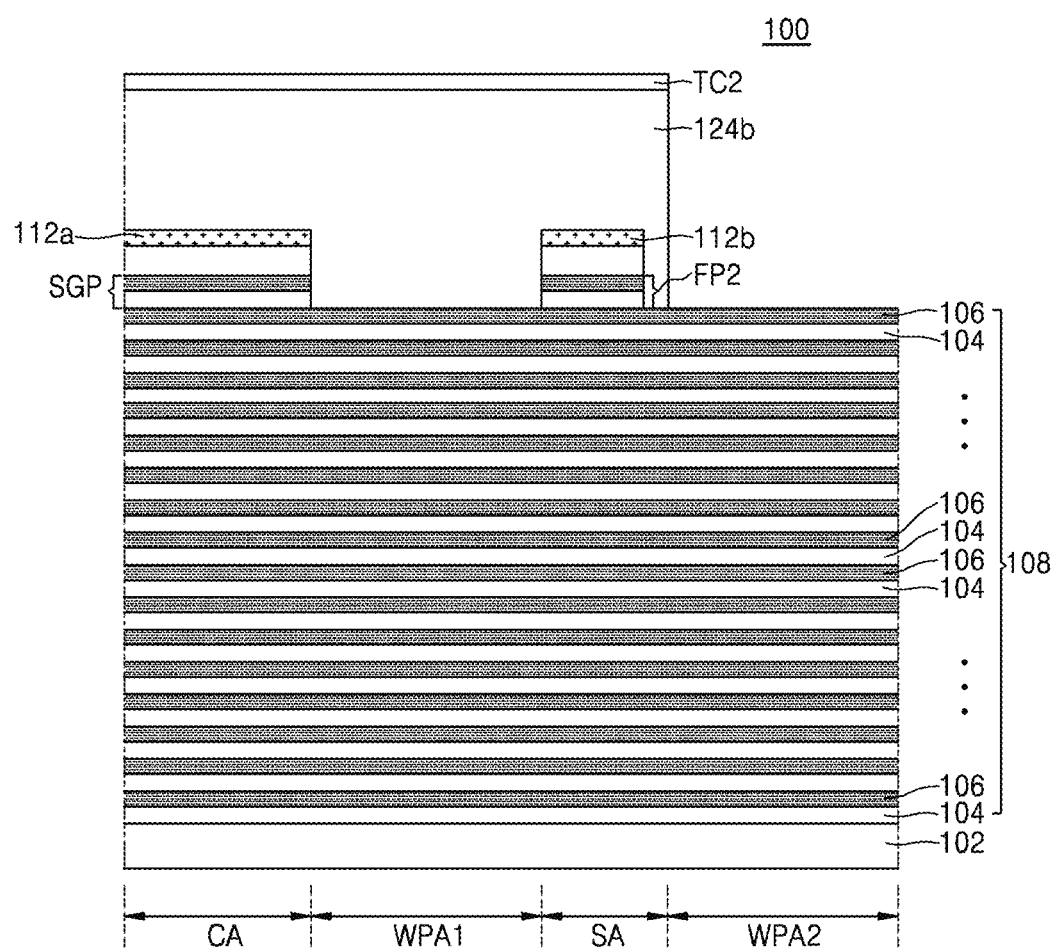

Referring to FIG. 4D, a second mask 124b is formed on the cell area CA, the first pad area WPA1, and the sacrificial area SA. The second mask 124b may be formed of the photoresist composition for DUV light according to any of the embodiments described herein, and may contain the compound of Chemical Formula 1 as a plasma light absorber. The second mask 124b may be patterned through a photolithographic process, such as described elsewhere herein. A top coating layer TC2 may be provided on the second mask 124b, and the top coating layer TC2 may not include the plasma light absorber of Chemical Formula 1. In some embodiments, the top coating layer TC2 may be omitted.

The plasma light absorber included in the photoresist composition for DUV light may transmit light of the first wavelength range well, and more particularly, light of the wavelength of about 248 nm, and thus may not influence an exposure process for forming the second mask 124b.

Figure 4E:
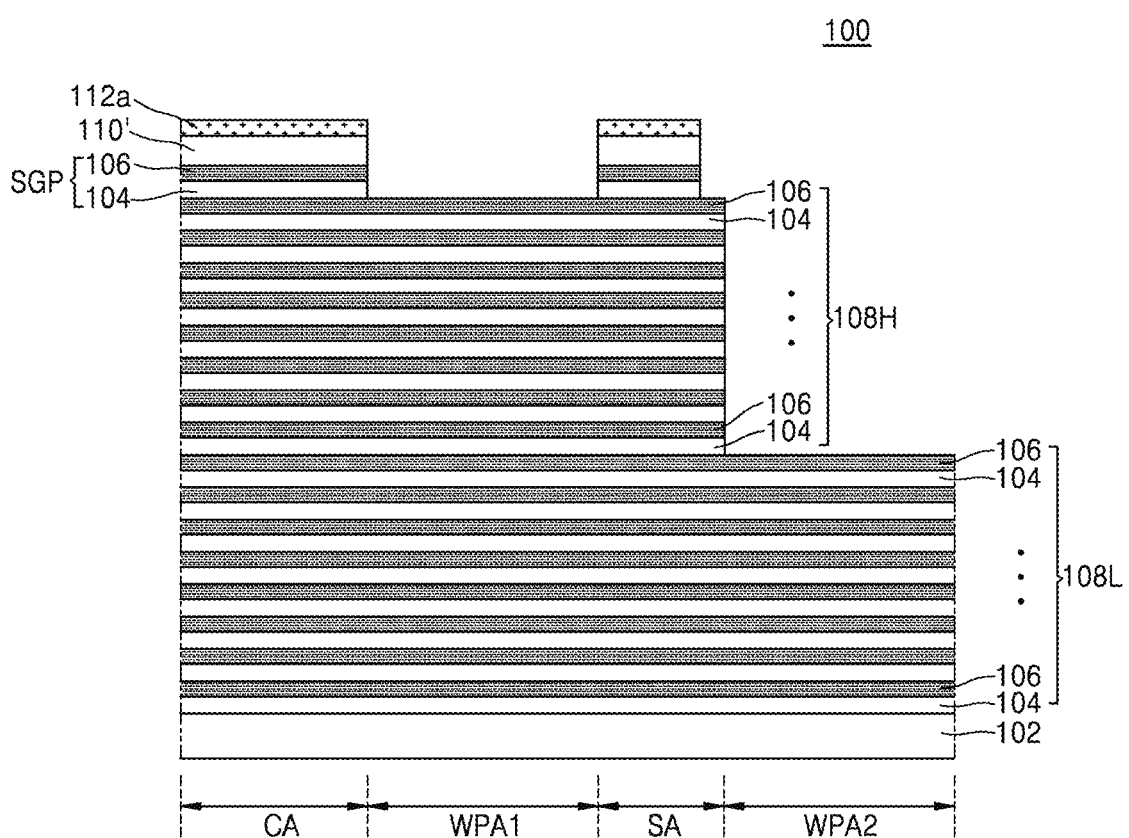

Referring to FIG. 4E, the upper preliminary stacked structure 108H corresponding to the second pad area WPA2 is removed by using the second mask 124b as a mask during a dry anisotropic etching process. The second mask 124b is then also removed (e.g., by an ashing process). Accordingly, only the lower preliminary stacked structure 108L may be present in the second pad area WPA2.

Since the second mask 124b should remain so that the cell area CA, the first pad area WPA1, and the sacrificial area SA are not exposed until the upper preliminary stacked structure 108H corresponding to the second pad area WPA2 is completely removed, the second mask 124b needs to have a sufficient thickness. When a thick photoresist material layer serving as the second mask 124b excessively absorbs light in the exposure process, a high-resolution pattern may not be obtained. For example, during the exposure process of a thick photoresist material layer, the light intensity received by the lower portion of the photoresist material may significantly differ from that received by the upper portion of the photoresist material when the second mask 124b excessively absorbs light (which may lead to different responses to the subsequent development of the lower and upper portions of the photoresist material).

The anisotropic etching process may be performed using $O_2$ plasma at a power of about 80 W to about 80 W. In this case, light emitted from the $O_2$ plasma may also be at least partially irradiated to the second masks 124b, and at least some of which may be absorbed by the plasma light absorber uniformly dispersed in the second masks 124b.

Figure 4F:
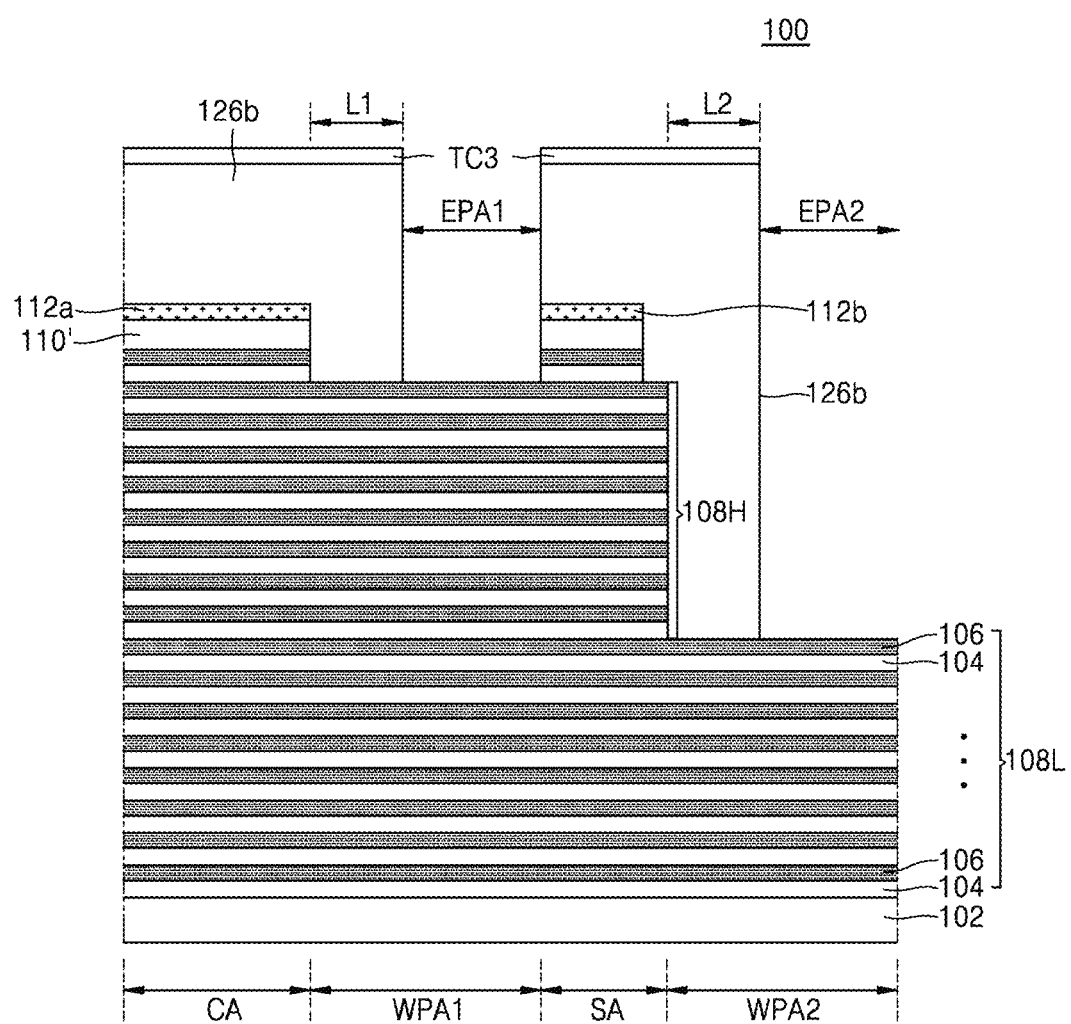

Referring to FIG. 4F, a third mask 126b is formed to cover the entirety of the cell area CA and a part L1 of the first pad area WPA1 and to cover the entirety of the sacrificial area SA and a part L2 of the second pad area WPA2.

The thickest part of the third mask 126b may have a thickness of about 5 micrometers (μm) to about 15 μm, or about 7 μm to about 12 μm.

The third mask 126b may be formed of the photoresist composition for DUV light according to any of the embodiments described herein, and may contain the compound of Chemical Formula 1 as a plasma light absorber. A top coating layer TC3 may be provided on the third mask 126b, and the top coating layer TC3 may not include the plasma light absorber of Chemical Formula 1. In some embodiments, the top coating layer TC3 may be omitted.

The plasma light absorber included in the photoresist composition for DUV light may transmit light of the first wavelength range well, and more particularly, light having a wavelength of about 248 nm, and thus may not poorly influence an exposure process for forming the third mask 126b.

Blocking distances L1 and L2 of the first and second pad areas WPA1 and WPA2, which are covered by the third mask 126b, may be equal to or greater than a value obtained by multiplying an exposed horizontal length of steps to be subsequently formed, by the number of steps. For example, each blocking distance L1 and L2 may be equal to or greater than the sum of tread portions of steps to be subsequently formed under the locations of the blocking distances denoted in FIG. 4F.

A part of the first pad area WPA1, which is not covered by the third mask 126b, is referred to as a first exposed area EPA1, and a part of the second pad area WPA2, which is not covered by the third mask 126b, is referred to as a second exposed area EPA2.

Figure 4G:
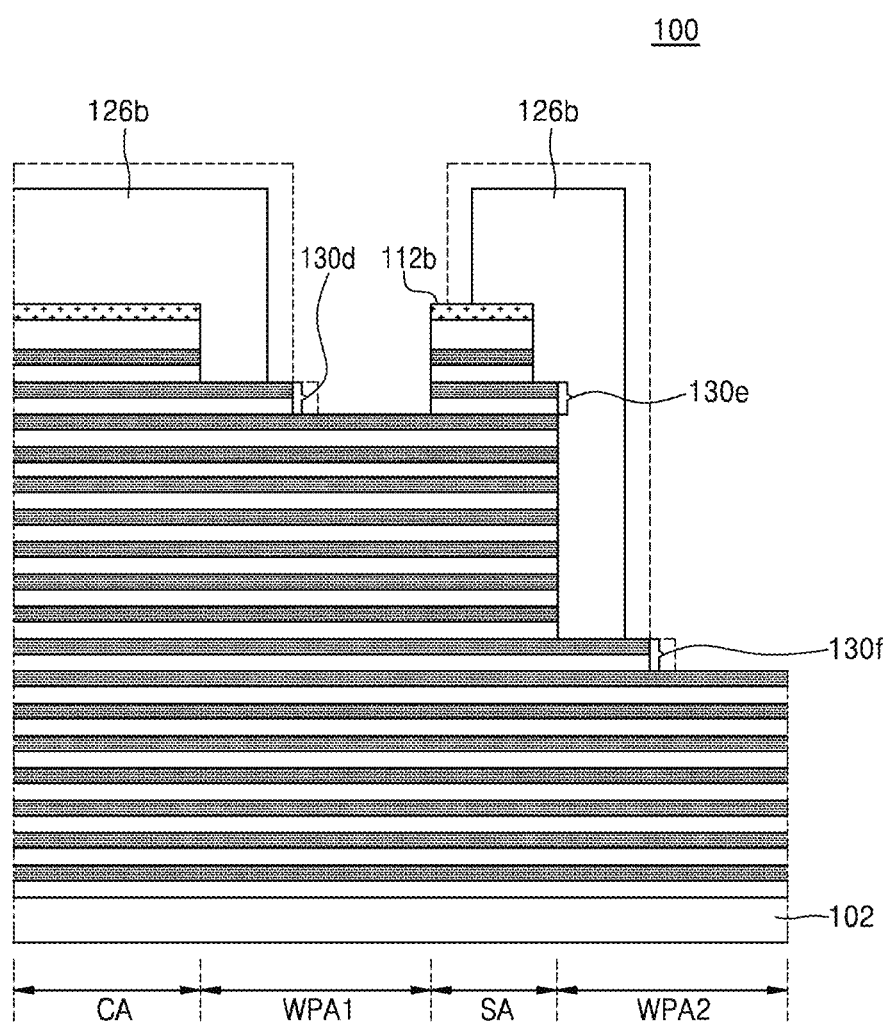

Referring to FIG. 4G, a step-forming etching process is performed to form first patterns 130d and 130f respectively exposed in the first and second pad areas WPA1 and WPA2.

The step-forming etching process may be performed using $O_2$ plasma at a power of about 80 W to about 80 W. In this case, light emitted from the $O_2$ plasma may also be at least partially irradiated onto the third mask 126b, and may be absorbed by the plasma light absorber uniformly dispersed in the third mask 126b.

The second etching process may include a process of removing portions of different sacrificial layers 106 respectively exposed in the first and second exposed areas EPA1 and EPA2, and portions of the interlayer dielectric layers 104 under these portions of the sacrificial layers 106 using an anisotropic etching process. The anisotropic etching process may be performed using $O_2$ plasma at a power of about 80 W to about 80 W as describe herein. After the anisotropic etching process, the top and side surfaces of the third mask 126b may be partially removed therefrom (e.g., conformally, as represented by the dashed line in FIG. 4G) based on an isotropic etching process. Accordingly, first patterns 130d, 130e, and 130f are respectively formed in the areas WPA1, SA, and WPA2 and, subsequently, ends of the first patterns 130d and 130f may be respectively exposed in the first and second pad areas WPA1 and WPA2. The first pattern 130e is separate from the first pattern 130d of the first pad area WPA1 and may be formed in the sacrificial area SA, and a side surface of the separate first pattern 130e (left side surface in the example of FIG. 4G) may be vertically aligned with a side surface of the etch stop pattern 112b thereabove.

Figure 4H:
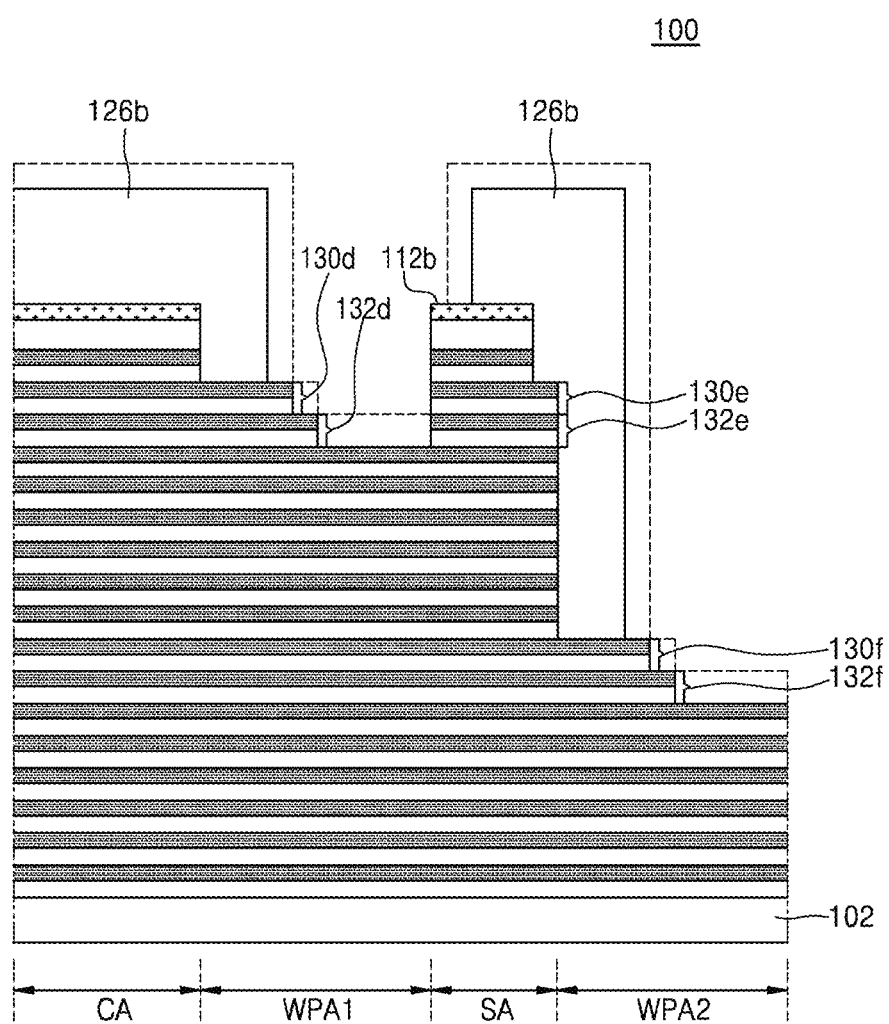

Referring to FIG. 4H, a third etching process, i.e., a step-forming process, is performed to respectively form second patterns 132d, 132e, and 132f under the first patterns 130d, 130e, and 130f. The step-forming etching process of FIG. 4H may comprise the anisotropic etching process followed by the isotropic etching process described with respect to FIG. 4G to achieve similar results with respect to second patterns 132d, 132e and 132f. In addition, exposed end portions of first patterns 130d and 130f may be removed.

Due to the third etching process, the second patterns 132d, 132e, and 132f are respectively formed under the first patterns 130d, 130e, and 130f in the areas WPA1, SA, and WPA2 and, at the same time, ends of the first patterns 130d and 130f and the second patterns 132d and 132f may be formed in step shapes and the ends of the second patterns 132d and 132f may be exposed from underneath sides of the third mask 126b.

The second pattern 132e may be separate from the second pattern 132d of the first pad area WPA1 and may be formed in the sacrificial area SA, and a side surface of the second pattern 132e, which is adjacent to the first pad area WPA1, may be vertically aligned with a side surface of the first pattern 130e thereon (as well as aligned with the side surface of etch stop pattern 112b).

Figure 4I:
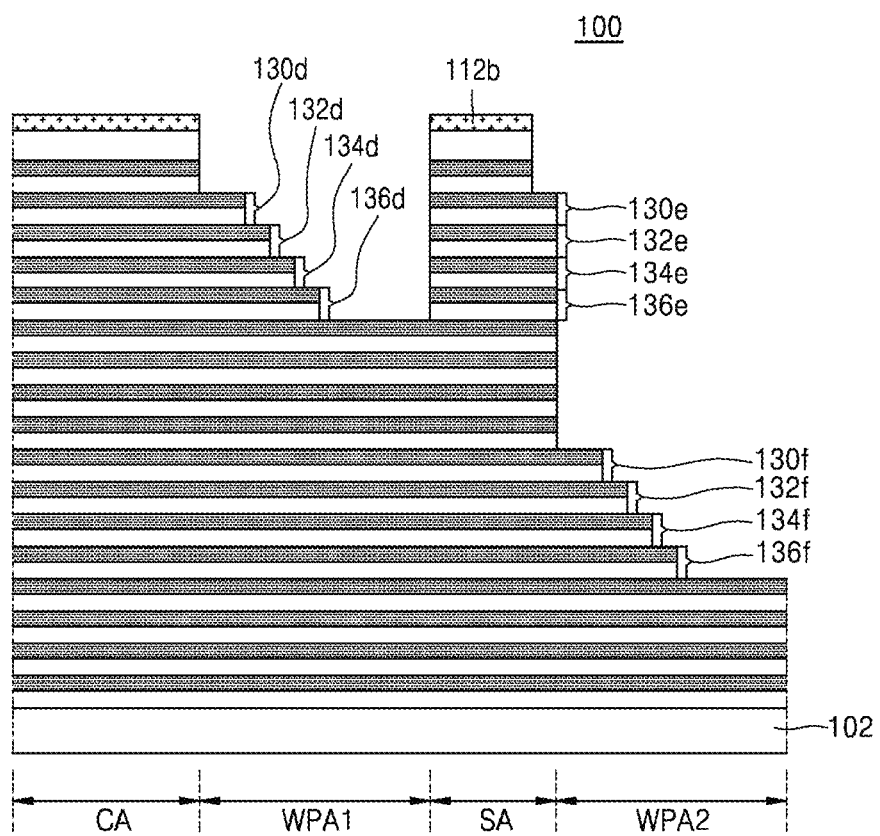

Referring to FIG. 4I, as a result of the above-described multiple etching processes (step-forming processes as described herein) using the third mask 126b, the first patterns 130d and 130f, the second patterns 132d and 132f, third patterns 134d and 134f, and fourth patterns 136d and 136f may be formed in the first and second pad areas WPA1 and WPA2. Side surfaces of first to fourth patterns 130e, 132e, 134e, and 136e in the sacrificial area SA, which are adjacent to the first pad area WPA1, may be vertically aligned because the etch stop pattern 112b is present in the sacrificial area SA unlike in the first and second pad areas WPA1 and WPA2 and thus the first to fourth patterns 130e, 132e, 134e, and 136e under the etch stop pattern 112b are substantially protected from subsequent etching after their formation.

Further processes may be performed in manufacturing the semiconductor device. For example, the remaining portions of the sacrificial layers 106 may be removed with the resulting spaces formed between the patterned dielectric layers 104 being filled with other materials. For example, each space may be being sequentially filled with a tunnel insulating layer, a charge trap layer, a gate insulating layer and a conductive electrode (e.g., a gate electrode forming a word line). Vertical semiconductor pillars may be formed through portions of this modified stack structure (e.g., including patterned dielectric layers 104 formed in a stair-step configuration and these additional layers formed therebetween) in the cell area CA to form a vertically extending NAND string of memory cell transistors to thereby form a 3D NAND (or vertical NAND) semiconductor device. Such additional exemplary processes may be conventional.

Although the method described above is directed to a particular example of using a photoresist composition, it will be apparent the patterning of other target layers in a semiconductor manufacturing process may be implemented within the scope of this invention. For example, although a target layer in the above example comprised plural sub-layers (e.g., sacrificial layer 106 and dielectric layer 104), different target layers may be patterned in other examples (such as patterning a single dielectric layer or such as patterning a substrate, such as substrate 102). In addition, while embodiments herein are described with respect to use of particular plasma light absorbers having particular light transmittance and absorbance properties, it will be appreciated that other plasma light absorbers with other light transmittance and absorbance properties, such as having reduced transmittance with respect to photolithographic light other than DUV and having increased absorbance with respect to light emitted from plasma other than oxygen plasma, may also be used.

While the inventive concept has been particularly shown and described with reference to embodiments thereof, it will be understood that various changes in form and details may be made therein without departing from the spirit and scope of the following claims.

What is claimed is:

1. A photoresist composition for deep ultraviolet (DUV) light, the photoresist composition comprising:
   a polymer;
   a photoacid generator capable of generating an acid when exposed to DUV light;
   a plasma light absorber compound; and
   an organic solvent,
   wherein the polymer is configured to undergo a chemical reaction when the photoresist composition is exposed to DUV light, wherein acid generated by the photoacid generator is capable of causing the polymer to undergo a chemical reaction such that the chemical composition of the polymer is capable of being altered due to the generated acid,
   wherein the maximum absorbance of the plasma light absorber compound for light within a first wavelength range is 0.5 or less times the maximum absorbance of the plasma light absorber compound for light within a second wavelength range,
   wherein the first wavelength range is from about 240 nm to about 255 nm, and wherein the photoacid generator is capable of generating an acid when exposed to DUV light in the first wavelength range,
   wherein the second wavelength range is from about 270 nm to about 330 nm, and wherein the plasma light absorber compound is capable of absorbing plasma light in the second wavelength range so as to suppress a photochemical reaction of the photoacid generator due to the plasma light.

2. The photoresist composition of claim 1, wherein a content of the plasma light absorber is about 1 weight % (wt %) to about 5 wt % with respect to a total weight of the photoresist composition.

3. The photoresist composition of claim 1, wherein the plasma light absorber has a structure of Chemical Formula 1:

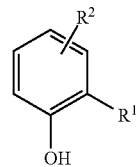

[Chemical Formula 1]

where $R^1$ is a C1-C4 alkyl group, a C1-C4 alkoxy group, a carboxyl group, or —$R^I$—COOH where $R^I$ is a C1-C4 alkylenyl group, and where $R^2$ is an aldehyde group, —$R^{II}$—CHO, a carboxyl group, —$R^I$—COOH, an amine, amide, or acrylic group that is unsubstituted or substituted with a C1-C4 alkyl group, or a C2-C6 acyl group, where $R^I$ is a C1-C4 alkylenyl group an $R^{II}$ is a C1-C4 alkylenyl group.

4. The photoresist composition of claim 3, wherein $R^1$ is a methoxy or ethoxy group.

5. The photoresist composition of claim 4, wherein $R^2$ is an aldehyde group.

6. The photoresist composition of claim 5, wherein the plasma light absorber has a structure of Chemical Formula 2:

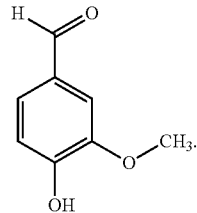

[Chemical Formula 2]

7. The photoresist composition of claim 1, wherein the average absorbance of the plasma light absorber for light of the first wavelength range is 0.5 or less times the average absorbance of the plasma light absorber for light of the second wavelength range.

8. A photoresist composition, the photoresist composition comprising:
a polymer;
a photoacid generator capable of generating an acid when exposed to DUV light wherein the generated acid is capable of causing the polymer to undergo a chemical reaction such that the chemical composition of the polymer is capable of being altered due to the generated acid;
a plasma light absorber compound that is capable of absorbing plasma light and suppressing a photochemical reaction of the photoacid generator due to the plasma light; and
an organic solvent,
wherein the plasma light absorber compound has a structure of Chemical Formula 1:

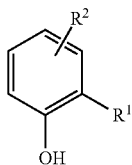

[Chemical Formula 1]

where $R^1$ is a C1-C4 alkyl group, a C1-C4 alkoxy group, a carboxyl group, or —$R^I$—COOH where $R^I$ is a C1-C4 alkylenyl group, and
where $R^2$ is an aldehyde group, —$R^{II}$—CHO, a carboxyl group, —$R^I$—COOH, an amine, amide, or acrylic group that is unsubstituted or substituted with a C1-C4 alkyl group, or a C2-C6 acyl group, where $R^I$ is a C1-C4 alkylenyl group and $R^{II}$ is a C1-C4 alkylenyl group.

9. The photoresist composition of claim 8, wherein a central element of the photoacid generator is sulfur or iodine.

10. The photoresist composition of claim 9, wherein the photoacid generator comprises at least one phenyl group or a derivative thereof bonded to the central element.

11. The photoresist composition of claim 10,
wherein the central element is sulfur, and
wherein the photoacid generator has a structure of Chemical Formula 3 or 4:

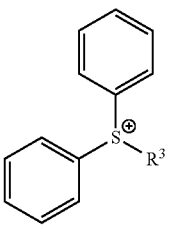

[Chemical Formula 3]

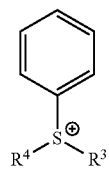

[Chemical Formula 4]

where each of $R^3$ and $R^4$ is a substituted or unsubstituted C1-C60 alkyl or alkoxy group, a carboxyl group, —$R^I$—COOH, a substituted or unsubstituted C2-C60 alkenyl or alkynyl group, or a substituted or unsubstituted C3-C60 cycloalkyl group, where $R^I$ is a C1-C60 alkylenyl group.

12. The photoresist composition of claim 10,
wherein the central element is iodine, and
wherein the photoacid generator has a structure of Chemical Formula 5:

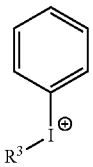

[Chemical Formula 5]

where $R^3$ is a substituted or unsubstituted C1-C60 alkyl or alkoxy group, a carboxyl group, —$R^I$—COOH, a substituted or unsubstituted C2-C60 alkenyl or alkynyl group, or a substituted or unsubstituted C3-C60 cycloalkyl group, where $R^I$ is a C1-C60 alkylenyl group.

13. The photoresist composition of claim 8, wherein a content of the photoacid generator is about 1 weight % (wt %) to about 10 wt % with respect to a total weight of the photoresist composition.

14. A method of manufacturing a semiconductor device comprising:
forming, on a substrate, a target layer, the target layer comprising at least one dielectric layer;
forming on the target layer, a layer of a photoresist composition for deep ultraviolet (DUV) light;
selectively exposing the layer of the photoresist composition for DUV light to krypton fluoride (KrF) laser light through a photo mask;
forming a photoresist pattern by developing the exposed layer of the photoresist composition; and
patterning the target layer in a plasma environment using the photoresist pattern as an etching mask,
wherein the photoresist composition for DUV light comprises a plasma light absorber capable of at least partially absorbing light emitted in the plasma environment, and
wherein the plasma light absorber has a structure of Chemical Formula 1:

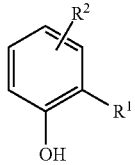

[Chemical Formula 1]

where $R^1$ is a C1-C4 alkyl group, a C1-C4 alkoxy group, a carboxyl group, or —$R^I$—COOH $R^I$ is a C1-C4 alkylenyl group, and
where $R^2$ is an aldehyde group, —$R^{II}$—CHO where $R^{II}$ is a C1-C4 alkylenyl group, a carboxyl group, —$R^I$—COOH $R^I$ is a C1-C4 alkylenyl group, an amine, amide, or acrylic group that is unsubstituted or substituted with a C1-C4 alkyl group, or a C2-C6 acyl group.

15. The manufacturing method of claim 14, wherein the plasma light absorber is uniformly dispersed throughout the layer of the photoresist composition for DUV light.

16. The manufacturing method of claim 14, further comprising forming a top coating layer on the layer of the photoresist composition for DUV light, before the exposing,
wherein the top coating layer does not comprise the plasma light absorber.

17. The manufacturing method of claim 14, wherein the layer of the photoresist composition for DUV light has a thickness of about 5 μm to about 15 μm.

18. The manufacturing method of claim 14,
wherein the maximum transmittance of the plasma light absorber for light of a first wavelength range is 1.1 or more times the maximum transmittance of the plasma light absorber for light of a second wavelength range,
wherein the first wavelength range is from about 240 nm to about 255 nm, and
wherein the second wavelength range is from about 270 nm to about 330 nm.

\* \* \* \* \*